(12) United States Patent
Kawahito et al.

(10) Patent No.: US 9,270,258 B2
(45) Date of Patent: Feb. 23, 2016

(54) LAMP SIGNAL GENERATION CIRCUIT AND CMOS IMAGE SENSOR

(71) Applicant: NATIONAL UNIVERSITY CORPORATION SHIZUOKA UNIVERSITY, Shizuoka-shi, Shizuoka (JP)

(72) Inventors: Shoji Kawahito, Hamamatsu (JP); Kaita Imai, Hamamatsu (JP)

(73) Assignee: NATIONAL UNIVERSITY CORPORATION SHIZUOKA UNIVERSITY (JP)

( * ) Notice: Subject to any disclaimer, the term of this patent is extended or adjusted under 35 U.S.C. 154(b) by 33 days.

(21) Appl. No.: 14/358,970

(22) PCT Filed: Nov. 14, 2012

(86) PCT No.: PCT/JP2012/079535
§ 371 (c)(1),
(2) Date: May 16, 2014

(87) PCT Pub. No.: WO2013/073585
PCT Pub. Date: May 23, 2013

(65) Prior Publication Data
US 2014/0319325 A1 Oct. 30, 2014

(30) Foreign Application Priority Data
Nov. 16, 2011 (JP) ................... 2011-250777

(51) Int. Cl.
H01L 27/00 (2006.01)
H03K 4/90 (2006.01)
H04N 5/378 (2011.01)
H03K 4/02 (2006.01)
H04N 5/376 (2011.01)
H03M 1/06 (2006.01)
H03M 1/56 (2006.01)
H03M 1/12 (2006.01)

(52) U.S. Cl.
CPC ............... *H03K 4/90* (2013.01); *H03K 4/026* (2013.01); *H03M 1/0646* (2013.01); *H04N 5/376* (2013.01); *H04N 5/378* (2013.01); *H03M 1/123* (2013.01); *H03M 1/56* (2013.01)

(58) Field of Classification Search
CPC ........................................... H04N 5/378
USPC ..................................... 250/208.1
See application file for complete search history.

(56) References Cited

U.S. PATENT DOCUMENTS

2007/0279506 A1* 12/2007 Sato .............................. 348/302
2010/0110257 A1* 5/2010 Hiyama et al. ............. 348/308
2012/0006972 A1* 1/2012 Yoo ............................. 250/208.1

FOREIGN PATENT DOCUMENTS

EP 2 182 722 A2 5/2010
JP 2007-088971 4/2007
(Continued)

OTHER PUBLICATIONS

Extended European Search Report dated Jul. 14, 2015 in corresponding European Application No. 12850707.6.
(Continued)

*Primary Examiner* — Thanh Luu
(74) *Attorney, Agent, or Firm* — Ostrolenk Faber LLP

(57) ABSTRACT

A ramp signal generation circuit 21 comprises a plurality of unit circuits $22_1$ to $22_N$, each including a capacitor 26 having one end 26a held at a fixed potential and a current source 27 connected to the other end 26b of the capacitor 26, while the other ends 26b of the capacitors 26 in the plurality of unit circuits $22_1$ to $22_N$ are connected to each other with a wiring member W.

4 Claims, 5 Drawing Sheets

(56) References Cited

FOREIGN PATENT DOCUMENTS

| | | |
|---|---|---|
| JP | 2008-309811 | 12/2008 |
| JP | 2009-130828 | 6/2009 |

OTHER PUBLICATIONS

PCT/IB/338 Notification of Transmittal of Translation of the International Preliminary Report on Patentability dated May 30, 2014 and PCT/IB/373 International Preliminary Report on Patentability in counterpart International Application No. PCT/JP2012/079535 dated May 20, 2014 in English.

International Search Report mailed Dec. 11, 2012 in counterpart International Application No. PCT/JP2012/079535.

Yong Lim et al., "A 1.1e Temporal Noise 1/3.2-inch 8Mpixel CMOS Image Sensor using Pseudo-Multiple Sampling", ISSCC 2010 Dig. Tech. Papers, pp. 396-398.

Sakkarapani Balagopal et al., "An On-chip Ramp Generator for Single-Slope Look Ahead Ramp (SSLAR) ADC", IEEE MWSCAS 2009, 2009, pp. 373-376.

* cited by examiner

RAMP SIGNAL GENERATION CIRCUIT AND CMOS IMAGE SENSOR

CROSS-REFERENCE TO RELATED APPLICATIONS

The present application is a 35 U.S.C. §§371 national phase conversion of PCT/JP2012/079535, filed Nov. 14, 2012, which claims priority to Japanese Patent Application No. 2011-250777, filed Nov. 16, 2011, the contents of both of which are incorporated herein by reference. The PCT International Application was published in the Japanese language.

TECHNICAL FIELD

The present invention relates to a ramp signal generation circuit and a CMOS image sensor.

BACKGROUND ART

Known as a technique for processing an analog signal is one which generates a ramp signal by a ramp signal generation circuit and compares the analog signal with the ramp signal as a reference signal, so as to process the analog signal. For example, the following Patent Literature 1 discloses a technique for AD-converting analog signals outputted from respective pixels in the field of CMOS (Complementary Metal Oxide Semiconductor) image sensors. Counting with a clock signal is started simultaneously with supplying a comparator with a ramp-shaped reference voltage. When an analog signal inputted from a pixel having a light-receiving element equals the reference voltage, the counting action is stopped, and the count value at this point of time is latched as pixel data. This makes it possible to output a digital signal corresponding to the analog signal. Non Patent Literatures 1 and 2 also disclose similar techniques.

CITATION LIST

Patent Literature

Patent Literature 1: Japanese Patent Application Laid-Open No. 2007-88971

Non Patent Literature

Non Patent Literature 1: Yong Lim et al., "A 1.1e⁻ Temporal Noise 1/3.2-inch 8 Mpixel CMOS Image Sensor Using Pseudo-Multiple Sampling", ISSCC 2010 Dig. Tech. Papers, pp. 396-398.
Non Patent Literature 2: Sakkarapani Balagopal et al., "An On-chip Ramp Generator for Single-Slope Look Ahead Ramp (SSLAR) ADC", IEEE MWSCAS 2009, pp. 373-376.

SUMMARY OF INVENTION

Technical Problem

In the technique disclosed in the above-mentioned Patent Literature 1, one comparator is provided for each column of pixels arranged in a two-dimensional lattice. A single reference voltage generator supplies a reference voltage to all the comparators. When such a structure is employed, timings at which the reference voltage reaches the comparators of the respective columns vary. Waveform distortions become greater in particular in comparators distanced from the reference voltage generator. While it is necessary for the timing differences and waveform distortions to be smaller in order to improve the accuracy in image sensors, the reference voltage generator must increase its power consumption therefor.

Hence, the comparator of each column may be provided with one ramp signal generation circuit for supplying the comparator with a reference voltage. Such a structure can solve the problem of timing differences and waveform distortions mentioned above.

When employing a structure in which comparators are provided with respective ramp signal generation circuits, variations in the ramp signal generation circuits may become problematic. A ramp signal generation circuit may be constructed as a circuit in which a constant current source and a capacitor are connected to each other, so as to charge and discharge the capacitor with the constant current source, for example. In this case, gradients of ramp signals generated by ramp signal generation circuits may vary because of variations in transistors constituting constant current sources and variations in capacitors. In particular, when the current caused by the constant current source to flow is lowered in order to reduce power consumption, the transistors and capacitors must reduce their sizes, which causes variations to become greater in the transistors and capacitors, thereby increasing variations in gradients of ramp signals.

Hence, in order to solve the problems mentioned above, it is an object of the present invention to provide a ramp signal generation circuit with smaller variations in gradients of ramp signals generated thereby and a CMOS image sensor using the same.

Solution to Problem

For achieving the above-mentioned object, the ramp signal generation circuit in accordance with one aspect of the present invention comprises a plurality of unit circuits, each including a capacitor having one end held at a fixed potential and a current source connected to the other end of the capacitor, while the other ends of the capacitors in the plurality of unit circuits are connected to each other with a wiring member.

In thus constructed ramp signal generation circuit, the other ends of the capacitors in the plurality of unit circuits are connected to each other with a wiring member, whereby a current flows through a lead connecting the other ends of the capacitors in the plurality of unit circuits such that the capacitors have the same voltage regardless of variations in capacity values of the capacitors and in magnitudes of currents caused by the current sources to flow. This reduces variations in gradients of ramp signals generated by the plurality of unit circuits.

The ramp signal generation circuit in accordance with this aspect of the present invention may further comprise a switch for connecting the other end of the capacitor to a reference potential line. This makes it possible to fix an initial voltage value at the time of generating the ramp signal by connecting the other end of the capacitor to the reference potential line.

In the ramp signal circuit in accordance with this aspect of the present invention, all of the capacitors in the plurality of unit circuits are designed to have the same capacity value, while all of the current sources in the plurality of unit circuits are designed such that currents having the same magnitude flow therefrom. This makes all of the unit circuits have substantially the same capacity value in their capacitors and substantially the same current value in their current sources, whereby the unit circuits generate ramp signals with substantially the same gradient.

The CMOS image sensor in accordance with another aspect of the present invention comprises a pixel array having pixels arranged two-dimensionally in a plurality of rows and a plurality of columns and a column-parallel ADC having the above-mentioned ramp signal generation circuit, while a plurality of unit circuits in the ramp signal generation circuits are provided so as to correspond to the respective columns of the pixel array.

Thus constructed CMOS image sensor reduces variations in gradients of ramp signals generated by a plurality of unit circuits corresponding to the respective columns of the pixel array, so as to lessen variations in characteristics among columns of the column-parallel ADC performing AD conversion according to the ramp signals, whereby the CMOS image sensor has smaller variations in characteristics among columns.

In the CMOS image sensor in accordance with this aspect of the present invention, the column-parallel ADC may comprise column ADCs connected to pixels of the respective columns of the pixel array, each column ADC comprising the unit circuit of the ramp signal generation circuit, a voltage comparator for comparing an output of the pixels of each column of the pixel array with an output of the unit circuit, and a counter for counting a time passing until an output of the voltage comparator changes. In thus constructed CMOS image sensor, variations are small in gradients of ramp signals generated by and outputted from the plurality of unit circuits. Therefore, variations are also small among columns in outputs of voltage comparators comparing the outputs of unit circuits with outputs of pixels in their corresponding columns of the pixel array and in outputs of counters based on the outputs of the voltage comparators. Hence, variations in characteristics among columns of the column-parallel ADC become smaller, thereby reducing variations in characteristics among columns of the CMOS image sensor.

Advantageous Effects of Invention

The ramp signal generation circuit of the present invention can generate ramp signals with smaller variations in gradients.

DESCRIPTION OF EMBODIMENTS

In the following, preferred embodiments of the ramp signal generation circuit in accordance with the present invention will be explained in detail with reference to the attached drawings. In the explanation of the drawings, the same constituents will be referred to with the same signs while omitting their overlapping descriptions.

Figure 1:
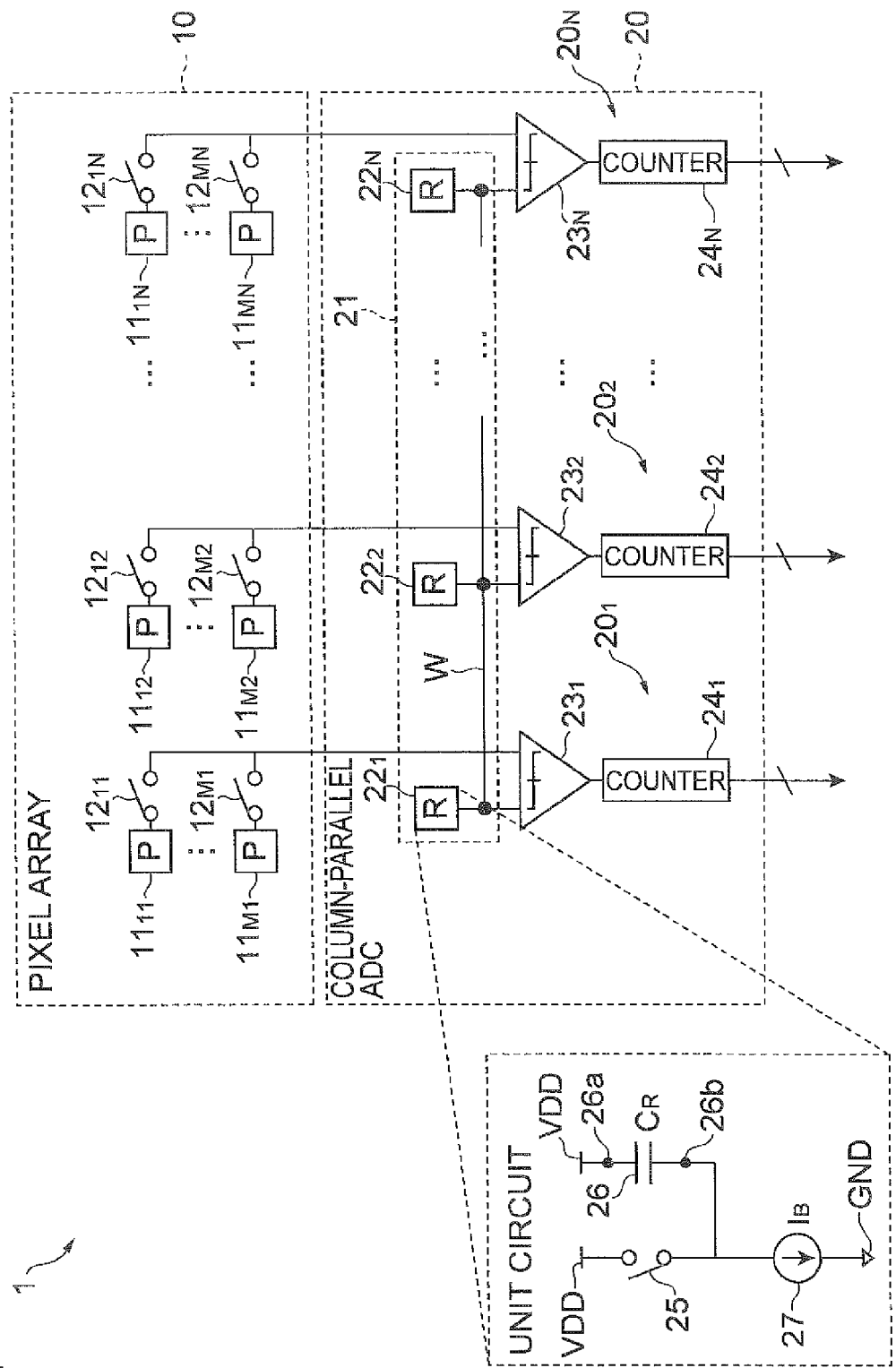
FIG. 1 is a block diagram illustrating the structure of a CMOS image sensor equipped with a ramp signal generation circuit in accordance with an embodiment of the present invention.

FIG. 1 is a block diagram illustrating the structure of a CMOS image sensor equipped with a ramp signal generation circuit in accordance with an embodiment of the present invention. This CMOS image sensor 1 is a device for converting an optical signal received by each pixel into an electric signal and outputting the latter. The CMOS image sensor 1 comprises a pixel array 10 and a column-parallel ADC (Analog to Digital Converter) 20.

The pixel array 10 receives light and outputs an analog signal corresponding to the intensity of the received light to the column-parallel ADC 20 in its subsequent stage. The pixel array 10 comprises pixels $11_{11}$ to $11_{1N}$, $11_{21}$ to $11_{2N}$, ..., $11_{M1}$ to $11_{MN}$ arranged two-dimensionally in M rows by N columns. Each pixel 11 has a known structure using a photodiode and a MOS transistor, for example. A switch $12_{ij}$ is connected to the pixel $11_{ij}$ arranged at the $i^{th}$ row, the $j^{th}$ column (where i is an integer of at least 1 but not more than M, and j is an integer of at least 1 but not more than N). The electric signal from the pixel $11_{ij}$ is read therefrom by turning the switch $12_{ij}$ on, so as to be outputted to a column ADC $20_j$ at the $j^{th}$ column of the column-parallel ADC 20 in the subsequent stage.

The column-parallel ADC 20 is a part for reading analog electric signals from the pixels 11 in N columns of the pixel array 10, AD-converting them into digital values, and outputting the latter. The column-parallel ADC 20, which is an AD converter known as a so-called integrating AD converter, comprises a ramp signal generation circuit 21, voltage comparators $23_1$ to $23_N$, and counters $24_1$ to $24_N$. The column-parallel ADC 20 is divided into N column ADCs $20_1$ to $20_N$. The column ADC $20_j$ (where j is an integer of at least 1 but not more than N) is connected to the pixels $11_1$ to $11_{Mj}$ at the $j^{th}$ column and includes the unit circuit $22_j$, voltage comparator $23_j$, and counter $24_j$.

The ramp signal generation circuit 21 comprises N unit circuits $22_1$ to $22_N$. The unit circuits $22_1$ to $22_N$ are connected to respective input terminals of the voltage comparators $23_1$ to $23_N$ at their corresponding columns. Each of the unit circuits $22_1$ to $22_N$ comprises a capacitor 26 and a current source 27. The capacitors 26 of the unit circuits $22_1$ to $22_N$ are designed to have the same capacity value. One end 26a of the capacitor 26 is connected to a power supply line VDD and has a fixed potential. The other end 26b of the capacitor 26 is connected to a current source 27. One end of a switch 25 is connected to the other end 26b of the capacitor 26, while the other end of the switch 25 is connected to the power supply line VDD (reference potential line). The switch 25 is one for connecting the other end 26b of the capacitor 26 to the power supply line VDD. Before the ramp signal generation circuit 21 starts a ramp signal generation operation, the switch 25 short-circuits the ends 26a, 26b of the capacitor 26, thereby resetting the potential of the other end 26b to that of the power supply line VDD. The other ends 26b of the capacitors in the unit circuits $22_1$ to $22_N$ are connected to each other with a metal line (wiring member) W. The current sources $27_1$ to $27_N$ of the unit circuits $22_1$ to $22_N$ are designed such that all of the currents flow therefrom have the same magnitude.

By "the same" in the specification is meant to include cases where capacity values of capacitors and current values of current sources vary within ranges which may vary depending on variations in manufacture and the like. Specifically, effects of this embodiment are favorably obtained when variations in element values fall within the range of about 20%.

The voltage comparators $23_1$ to $23_N$ compare the analog signals outputted from the pixel array 10 with the ramp signals outputted from the ramp signal generation circuit 21 and output two kinds of voltage level signals depending on whether the analog or ramp signal is greater in magnitude than the other. The counters $24_1$ to $24_N$ count times passing until the voltage levels of the signals outputted from their corresponding voltage comparators $23_1$ to $23_N$ change and output results of counting.

Operations of thus constructed CMOS image sensor 1 at the time of reading will now be explained. In general, the CMOS image sensor 1 reads the pixels 11 on one row simultaneously. The following will explain a case of reading the pixels to $11_{i1}$ to $11_{iN}$ on the $i^{th}$ row. First, the switch 25 is turned on, so as to reset the voltage of the other end $26b$ of the capacitor 26 to VDD. Subsequently, the switches $12_{i1}$ to $12_{iN}$ on the $i^{th}$ row are turned on, while the switches 12 on the other rows are turned off, so that the outputs of the pixels $11_{i1}$ to $11_{iN}$ are connected to respective one inputs of their corresponding voltage comparators $23_1$ to $23_N$. Then, the switch 25 is turned off, so as to start the ramp signal generation operation in each of the unit circuits $22_1$ to $22_N$, thereby inputting ramp signals as reference signals to the respective other inputs of the voltage comparators $23_1$ to $23_N$. Simultaneously with starting the ramp signal generation operation in the unit circuits $22_1$ to $22_N$, the counters $24_1$ to $24_N$ begin counting. The unit circuits $22_1$ to $22_N$ generate ramp signals which decrease monotonously. Therefore, the ramp signals outputted from the unit circuits $22_1$ to $22_N$ initially having higher voltages than the analog signals outputted from the pixels $11_{i1}$ to $11_{iN}$ become lower than the latter as their voltages decrease. The outputs of the voltage comparators $23_1$ to $23_N$ change at this moment. At the time when the outputs of the voltage comparators $23_1$ to $23_N$ change, the counters $24_1$ to $24_N$ stop counting and output the results of counting as digital signals. As the analog signals outputted from the pixels $11_{11}$ to $11_{iN}$ have lower voltages, the times passing until the outputs of the voltage comparators $23_1$ to $23_N$ change become longer, whereby the digital signals outputted from the counters $24_1$ to $24_N$ have greater values. Thus, the analog signals outputted from the pixels 11 to $11_{iN}$ are AD-converted, and the resulting digital signals are issued from the counters $24_1$ to $24_N$.

Since the foregoing operation converts the analog signals from the pixels 11 into digital signals, variations in gradients of ramp signals fed from the ramp signal generation circuit 21 to the voltage comparators 23, if any, will directly lead to variations in values outputted from the counters 24. Hence, in order to suppress variations among columns of the column-parallel ADC 20 and enhance accuracy, it is necessary to suppress variations in gradients of the ramp signals generated by the ramp signal generation circuit 21.

Figure 2:
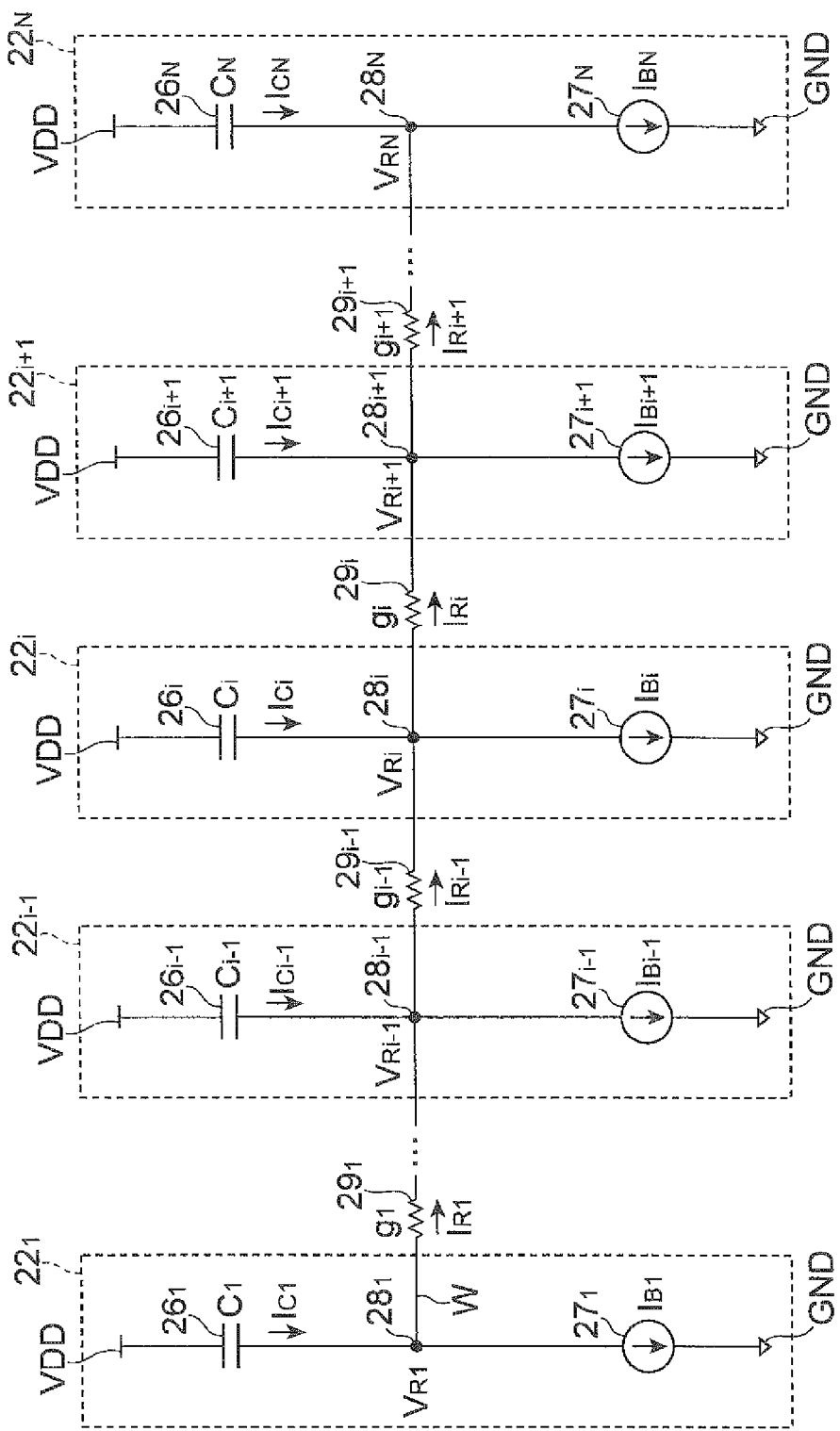
FIG. 2 is a circuit diagram of the ramp signal generation circuit in accordance with the embodiment of the present invention.

The ramp signal generation circuit 21 will now be explained in more detail with reference to FIG. 2. The ramp signal generation circuit 21 is constructed by arranging N unit circuits $22_1$ to $22_N$ side by side. The $i^{th}$ unit circuit $22_i$ includes the capacitor $26_i$ and current source $27_i$. The capacitor $26_i$ is connected between the power supply line VDD and a node $28_i$. The current source $27_i$ is connected between the node $28_i$ and a ground line GND. The current source $27_i$ is put into practice by operating an element such as a MOS transistor at a constant current, for example. The nodes $28_i$, $28_{i+1}$ are connected to each other with the metal line W. The electric resistance in the metal line W is represented as a wiring resistance $29_i$ in FIG. 2.

Variations in the ramp signals generated by the ramp signal generation circuit 21 explained in the foregoing will now be explained. Let $V_{Ri}$, $I_{Bi}$, $I_{Ci}$, and $I_{Ri}$; be the potential of the node $28_i$, the current caused by the current source $27_i$ to flow, the current flowing out of the capacitor $26_i$, and the current flowing from the node $28_i$ to the node $28_{i+1}$, respectively. Let $C_i$ and $g_i$ be the capacity value of the capacitor 26; and the reciprocal of the wiring resistance (conductance) between the nodes $28_i$, $28_{i+1}$, respectively. In this case, a vector $V_R$ whose elements are constituted by potentials of ramp signals generated at the nodes $28_1$ to $28_N$ and a vector $I_B$ whose elements are constituted by currents caused by the current sources $27_1$ to $27_N$ to flow can be defined as the following expression (1):

[Math. 1]

$$V_R = \begin{pmatrix} V_{R1} \\ \vdots \\ V_{RN} \end{pmatrix}, I_B = \begin{pmatrix} I_{B1} \\ \vdots \\ I_{BN} \end{pmatrix} \quad (1)$$

Then, from Kirchhoff's current law, a vector $dV_R/dt$ whose elements are constituted by gradients of potentials of ramp signals generated at the nodes $28_1$ to $28_N$ is calculated as follows:

[Math. 2]

$$\frac{dV_R}{dt} = C^{-1}(G \cdot V_R - I_B) \quad (2)$$

Here, C and G are matrices represented by the following expressions (3) and (4), respectively.

[Math. 3]

$$C = \begin{pmatrix} C_1 & 0 & \cdots & 0 \\ 0 & C_2 & \ddots & \vdots \\ \vdots & \ddots & \ddots & 0 \\ 0 & \cdots & 0 & C_N \end{pmatrix} \quad (3)$$

[Math. 4]

$$G = \begin{pmatrix} -g_1 & g_1 & 0 & \cdots & 0 \\ g_1 & -g_1-g_2 & g_2 & & \vdots \\ 0 & g_2 & \ddots & \ddots & 0 \\ \vdots & & \ddots & \ddots & g_{N-1} \\ 0 & \cdots & 0 & g_{N-1} & -g_{N-1} \end{pmatrix} \quad (4)$$

It is seen from the foregoing expressions (2) to (4) that variations in gradients of potentials of ramp signals change depending on variations in the capacity value $C_i$ of the capacitor $26_i$, variations in the current value $I_{Bi}$ of the current source $27_i$, and the wiring resistance $g_i$ between the nodes $28_i$, $28_{i+1}$.

Figure 3:
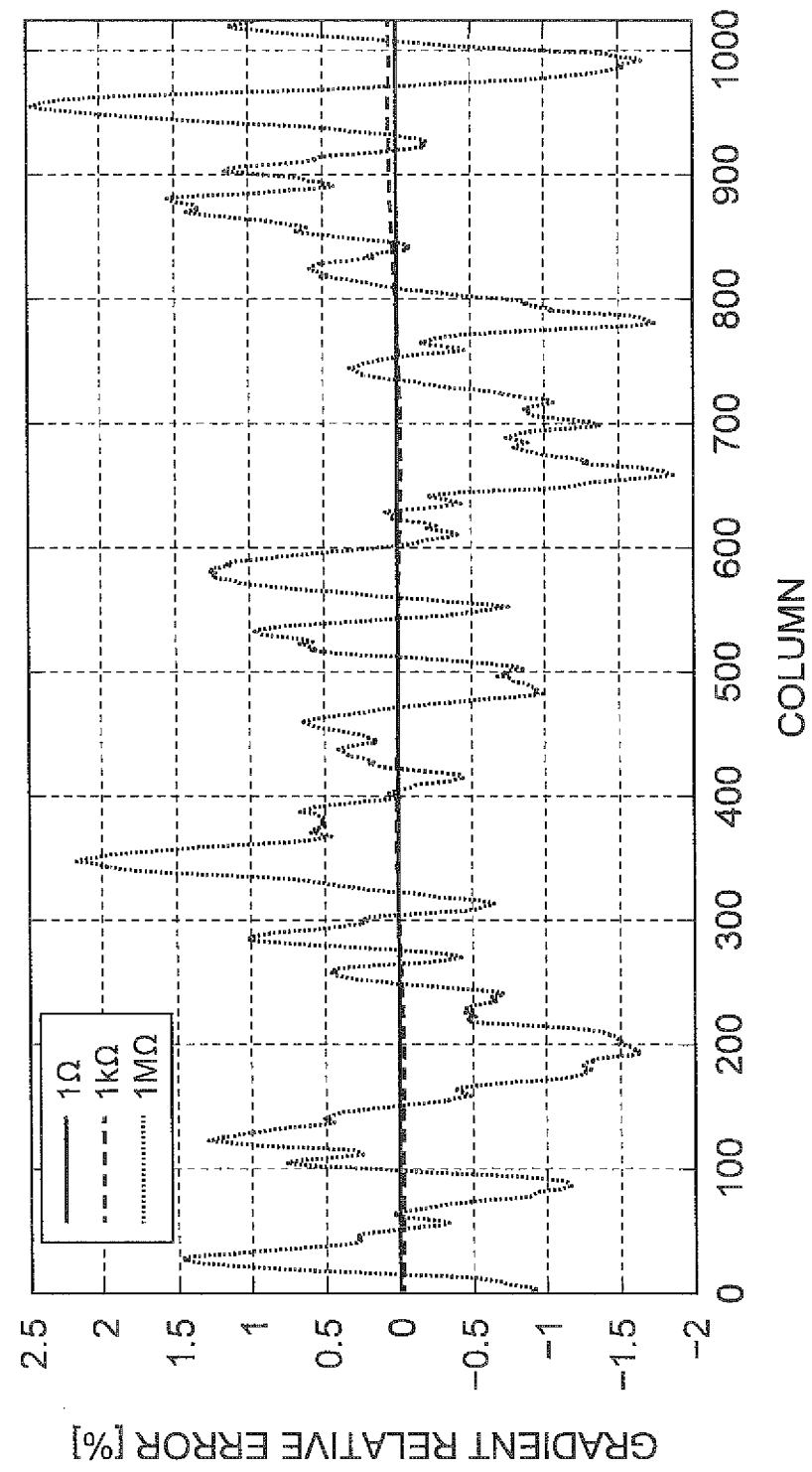
FIG. 3 is a chart illustrating relative errors in gradients of ramp signals generated by the ramp signal generation circuit in accordance with the embodiment of the present invention.
Figure 4:
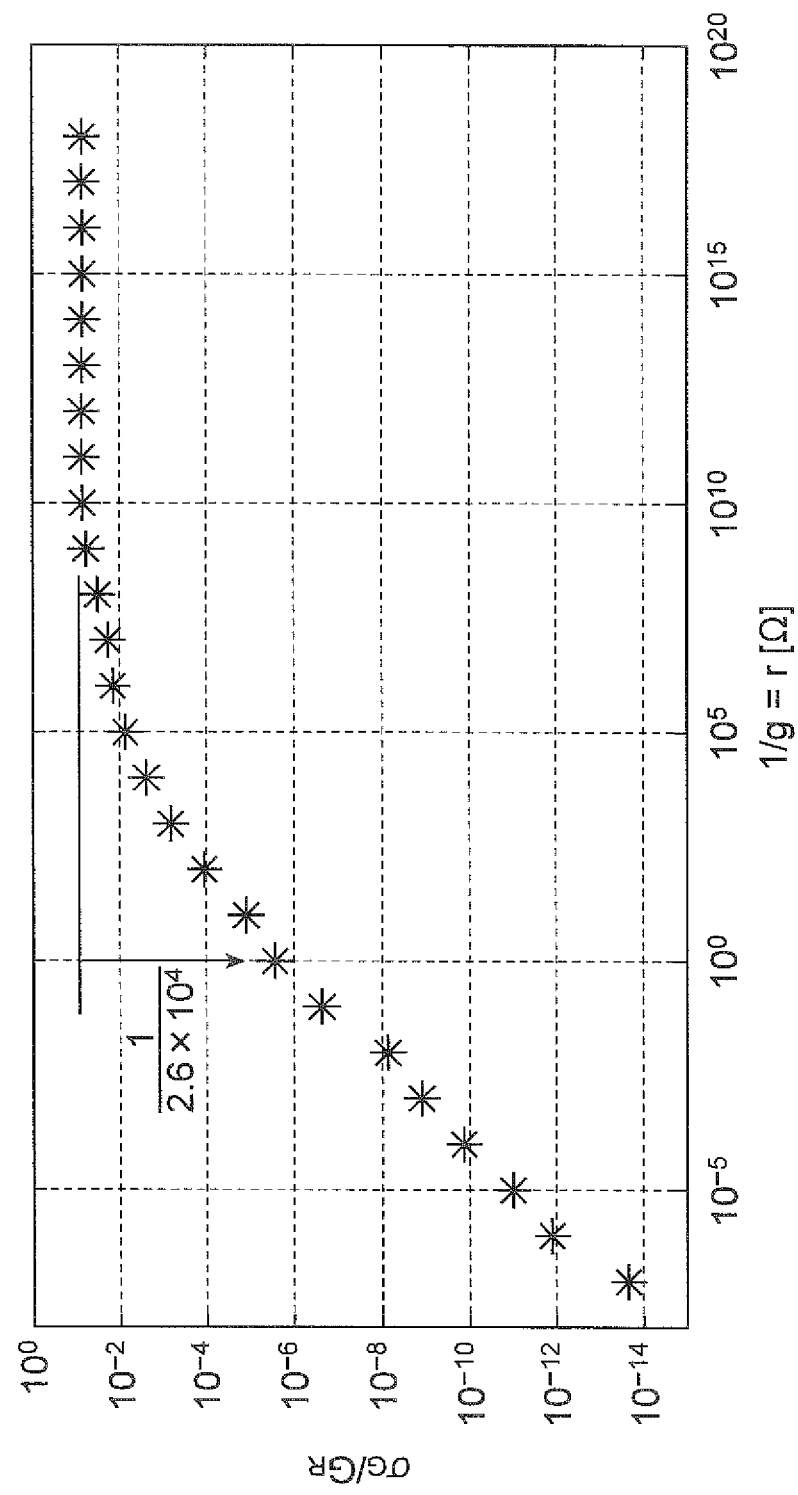
FIG. 4 is a chart illustrating the relationship between relative errors in gradients of ramp signals generated by the ramp signal generation circuit in accordance with the embodiment of the present invention and wiring resistance.
Figure 5:
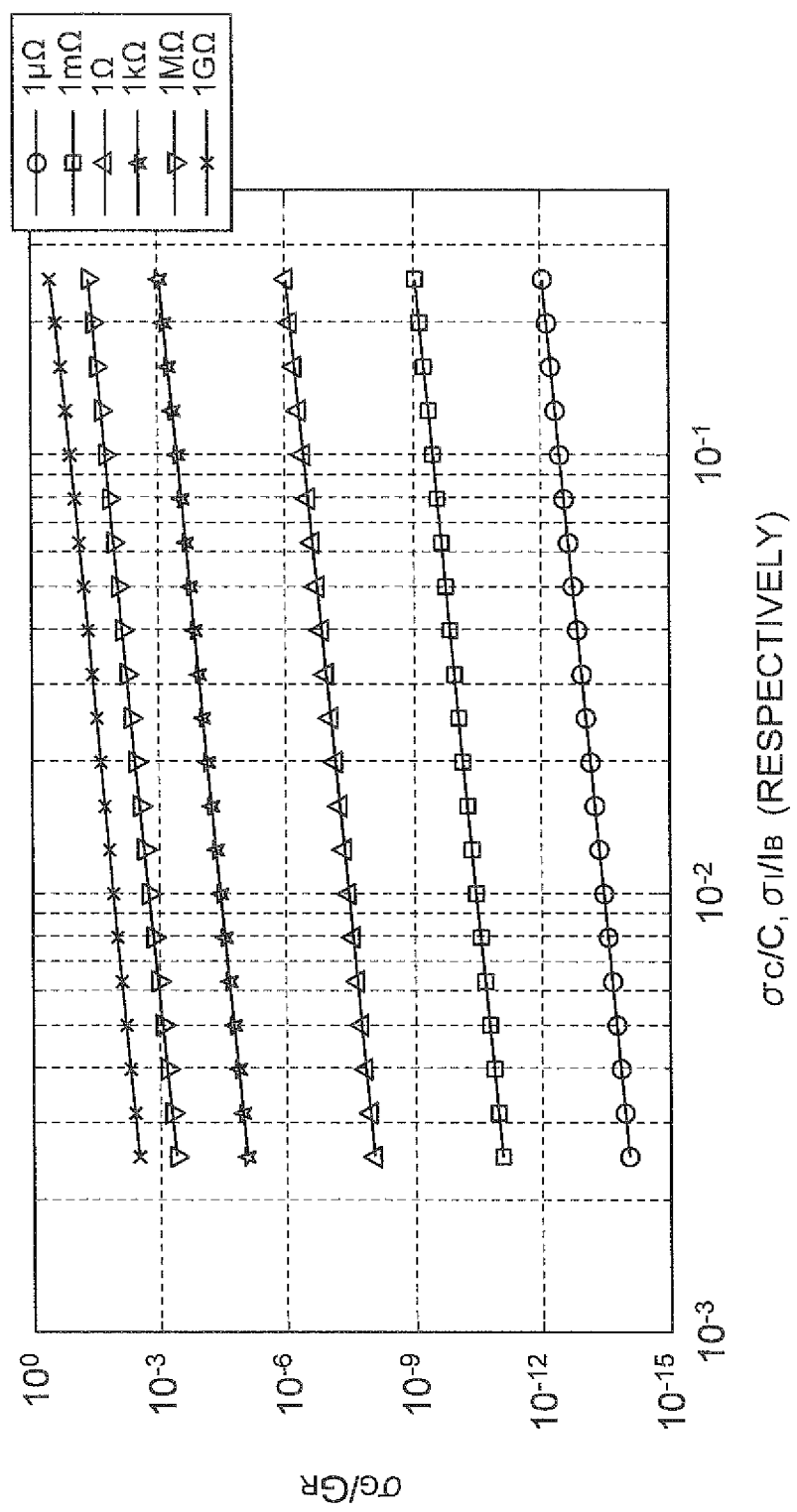
FIG. 5 is a chart illustrating relationships between relative errors in gradients of ramp signals generated by the ramp signal generation circuit in accordance with the embodiment of the present invention and variations in circuit elements.

FIGS. 3 to 5 illustrate results of numerical simulations of variations in gradients of ramp signals generated by thus constructed ramp signal generation circuit 21. The following assumes that N=1024. The wiring resistance value in the explanation of FIGS. 3 to 5 is the resistance value between the nodes $28_i$, $28_{i+1}$ adjacent to each other. In FIGS. 3 and 4, standard deviations of capacity values of capacitors $26_1$ to $26_{1024}$ and current values of current sources $27_1$ to $27_{1024}$ are calculated as 5% of their respective average values.

FIG. 3 is a chart illustrating relative errors in gradients of ramp signals generated by the ramp signal generation circuit 21. The abscissa indicates the column numbers of the unit circuits 22. The ordinate indicates the relative error in the gradient of the ramp signal generated by each unit circuit 22. When the wiring resistance is 1 MΩ, the relative error in gradients of ramp signals occurs by about 2.5% at most. When the wiring resistance is lowered to 1 kΩ, the relative error in gradients of ramp signals decreases to about 0.1%. When the wiring resistance is lowered to 1Ω, the relative error in gradients of ramp signals becomes substantially 0, so that there are essentially no variations in gradients of ramp signals. The wiring resistance of 1Ω is a value sufficiently achievable when making a circuit in practice.

FIG. 4 is a chart illustrating the wiring resistance and errors in gradients of ramp signals. In a region where the wiring resistance is large, $1\times10^9 \Omega$ or greater in particular, the relative error in gradients of ramp signals is about 0.07. The value of 0.07, which is about root 2 times 0.05, is calculated according to the law of error propagation from 0.05, which is the relative value of each of the standard deviations of two kinds of values, i.e., capacity values of the capacitors $26_1$ to $26_{1024}$ and current values of current sources $27_1$ to $27_{1024}$. On the other hand, the relative error in gradients of ramp signals become smaller as the wiring resistance is lowered. For example, when the wiring resistance is 1Ω, the relative error in gradients of ramp signals is $2.7\times10^{-6}$, which is 1/26000 of that in the case where the wiring resistance is 1 GΩ.

FIG. 5 is a chart illustrating relationships between relative values of standard deviations of capacity values of the capacitors $26_1$ to $26_{1024}$ and current values of current sources $27_1$ to $27_{1024}$ and relative errors in gradients of ramp signals. Here, calculation is performed while changing the wiring resistance value from 1 µΩ, to 1 GΩ. As FIG. 5 illustrates, relative errors in gradients of ramp signals tend to increase as the standard deviations of capacity values of the capacitors $26_1$ to $26_{1024}$ and current values of current sources $27_1$ to $27_{1024}$ become greater. However, FIG. 5 also illustrates that lowering the wiring resistance can reduce relative errors in gradients of ramp signals. For example, even in the case where each of the relative values of standard deviations of capacity values of the capacitors $26_1$ to $26_{1024}$ and current values of current sources $27_1$ to $27_{1024}$ is 0.2, i.e., 20%, which is a considerably large value, the relative error in gradients of ramp signals is suppressed to a very small value of about $1\times10^{-6}$ when the wiring resistance is 1Ω. Therefore, even when variations become greater in the capacitors 26 and current sources 27 as the capacitors 26 and the current values of the current sources 27 are made smaller in order to reduce power consumption, connecting the nodes 28 to each other with the low-resistance metal line W can suppress relative errors in gradients of ramp signals to low levels. Hence, while securing a required accuracy, the current values of the current sources 27 can be lowered, so as to reduce power consumption, and the capacitors 26 and elements constituting the current sources 27 can also be made smaller in size, so as to attain a smaller area.

In this embodiment, as explained in the foregoing, the ramp signal generation circuit 21 comprises a plurality of unit circuits 22 each including the capacitor 26 having one end held at a fixed potential and the current source 27 connected to the other end of the capacitor 26, while the other ends of the capacitors 26 in the plurality of unit circuits are connected to each other. Therefore, a current flows through a lead connecting the other ends of the capacitors 26 in the plurality of unit circuits such that the capacitors 26 have the same voltage regardless of variations in capacity values of the capacitors 26 and variations in magnitudes of currents caused by the current sources 27 to flow. This reduces variations in gradients of ramp signals generated by the plurality of unit circuits 22.

The ramp signal generation circuit in accordance with the present invention is not limited to the above-mentioned embodiment. For example, the unit circuit 22 may be constructed such that the capacitor 26 is connected between the node 28 and ground line GND, while the current source 27 is connected between the power supply line VDD and node 28, whereby the ramp signal generated by the unit circuit 22 monotonously increases.

The ramp signal generation circuit in accordance with the present invention is not limited to the use for CMOS image sensors, but may be used in various circuits utilizing ramp signals as reference signals. Materials for the wiring member connecting the nodes $28_i$, $28_{i+1}$ to each other are not limited to metals, but various known materials such as polysilicon, for example, may also be used.

INDUSTRIAL APPLICABILITY

The present invention provides a ramp signal generation circuit with smaller variations in gradients of ramp signals generated thereby and a CMOS image sensor using the same.

REFERENCE SIGNS LIST

1 ... CMOS image sensor; 10 ... pixel array; 11 ... pixel; 12 ... switch; 20 ... column-parallel ADC; $20_1$ to $20_N$ ... column ADC; 21 ... ramp signal generation circuit; 22 ... unit circuit; 23 ... voltage comparator; 24 ... counter; 25 ... switch; 26 ... capacitor; 27 ... current source; 28 ... node; 29 ... wiring resistance; VDD ... power supply line (reference potential line); W ... metal line (wiring member)

The invention claimed is:

1. A ramp signal generation circuit comprising:
a plurality of unit circuits which generate ramp signals,
each unit circuit including a capacitor having one end connected to a fixed potential line and a current source connected to the other end of the capacitor;
further comprising a switch which is operable for connecting the other end of the capacitor to a reference potential line;
wherein the other ends of the capacitors in the plurality of unit circuits are connected to each other with a wiring member so as to equalize voltages at the other ends of the capacitors in the plurality of unit circuits.

2. A ramp signal generation circuit according to claim 1, wherein all of the capacitors in the plurality of unit circuits are designed to have the same capacity value; and
wherein currents having the same magnitude flow from all of the current sources in the plurality of unit circuits.

3. A CMOS image sensor comprising:
a pixel array having pixels arranged two-dimensionally in a plurality of rows and a plurality of columns; and
a column-parallel ADC having the ramp signal generation circuit according to claim 1;
wherein a plurality of unit circuits in the ramp signal generation circuits are provided so as to correspond to the respective columns of the pixel array.

4. A CMOS image sensor according to claim 3, wherein the column-parallel ADC comprises column ADCs connected to pixels of the respective columns of the pixel array; and
wherein each of the column ADCs comprises:
the unit circuit of the ramp signal generation circuit;
a voltage comparator for comparing an output of the pixels of each column of the pixel array with an output of the unit circuit; and
a counter for counting a time passing until an output of the voltage comparator changes.

\* \* \* \* \*